(12) United States Patent
Dubey et al.

(10) Patent No.: US 10,891,992 B1
(45) Date of Patent: Jan. 12, 2021

(54) BIT-LINE REPEATER INSERTION ARCHITECTURE

(71) Applicant: Synopsys, Inc., Mountain View, CA (US)

(72) Inventors: Prashant Dubey, Greater Noida (IN); Jamil Kawa, Campbell, CA (US); Kritika Aditya, Rohini (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/897,101

(22) Filed: Feb. 14, 2018

Related U.S. Application Data

(60) Provisional application No. 62/460,078, filed on Feb. 16, 2017.

(51) Int. Cl.
*G11C 7/18* (2006.01)
*G11C 8/10* (2006.01)
*G11C 11/413* (2006.01)

(52) U.S. Cl.
CPC .............. *G11C 7/18* (2013.01); *G11C 8/10* (2013.01); *G11C 11/413* (2013.01)

(58) Field of Classification Search
CPC .............................. G11C 7/18; G11C 11/413
See application file for complete search history.

(56) References Cited

U.S. PATENT DOCUMENTS

| | | | |
|---|---|---|---|
| 5,886,930 A | 3/1999 | Maclellan et al. | |
| 6,130,550 A | * 10/2000 | Zaliznyak | H03K 19/17704 326/38 |
| 6,590,818 B1 | 7/2003 | Liston et al. | |
| 7,835,175 B2 | 11/2010 | Wang | |
| 8,437,204 B2 | 5/2013 | Yen-Huei | |
| 9,070,477 B1 | 6/2015 | Clark | |
| 2002/0157073 A1* | 10/2002 | Krishnamoorthy | G06F 30/327 257/773 |
| 2003/0081361 A1* | 5/2003 | Nuber | H01L 27/0255 361/54 |
| 2004/0025131 A1* | 2/2004 | Walia | G06F 30/392 716/103 |
| 2004/0032790 A1 | 2/2004 | Mori et al. | |
| 2006/0126417 A1* | 6/2006 | Akiyoshi | G11C 5/063 365/230.03 |
| 2008/0059933 A1* | 3/2008 | Barke | G06F 30/18 716/114 |
| 2008/0077899 A1* | 3/2008 | Dutt | G06F 30/327 716/114 |
| 2009/0059697 A1 | 3/2009 | Adams et al. | |

(Continued)

FOREIGN PATENT DOCUMENTS

JP 2004079077 A 3/2004

OTHER PUBLICATIONS

Patent Family Graph for JP2004079077 (1 page).

*Primary Examiner* — Jay W. Radke
(74) *Attorney, Agent, or Firm* — Nicholson De Vos Webster & Elliott LLP; Judith Szepesi

(57) ABSTRACT

An SRAM architecture to optimize the performance of the SRAM. The local bit-lines are activated one at a time with control signals from a decoder. The global bit-lines are broken with repeaters to optimize performance. This guarantees optimal performance for the SRAM array across a wide range of supply voltages spanning from the nominal voltage of a process to a sub-threshold range.

21 Claims, 4 Drawing Sheets

(56) References Cited

U.S. PATENT DOCUMENTS

| | | |
|---|---|---|
| 2009/0109732 A1 | 4/2009 | Houston |
| 2009/0303776 A1 | 12/2009 | Mair |
| 2010/0091585 A1 | 4/2010 | Wang |
| 2010/0200998 A1* | 8/2010 | Furuta .................. G11C 5/04 257/774 |
| 2010/0315890 A1 | 12/2010 | Yen-Huei |
| 2011/0007580 A1 | 1/2011 | Houston et al. |
| 2012/0314486 A1 | 12/2012 | Yoshimoto et al. |
| 2013/0246681 A1* | 9/2013 | Rao .................. G06F 1/3253 710/306 |
| 2014/0050033 A1 | 2/2014 | Otto et al. |

* cited by examiner

BIT-LINE REPEATER INSERTION ARCHITECTURE

RELATED APPLICATIONS

The present application claims priority to U.S. Provisional Patent Application No. 62/460,078, filed on Feb. 16, 2017 and incorporates that application by reference in its entirety.

FIELD

The present invention relates to static random access memory (SRAM) arrays, and more particularly to improving the access time of SRAM arrays with limited bit-cell read current or suffering from transmission line effects prevalent in advanced technology nodes.

BACKGROUND

Efficient memory design is centered on optimizing the multiplexing scheme of large arrays in the presence of a limited bit-cell current determining the rate of discharge of a bit-line and thus the speed of the SRAM. At nominal operating voltage bit-cell current is always limited by the limitations of any particular technology. Also, the percentage of manufacturing related random and systematic variability increases with every new advanced node. The resistivity and per length capacitance of interconnect have been going up simultaneously with every new technology node, rendering the discharge of bit-lines slower.

Memories are often required to operate significantly below nominal voltage. At sub-nominal supply voltages, the bit-cell read current deteriorates significantly and the impact of higher variability is exacerbated and amplified. Therefore, to keep the density of a memory array high an efficient multiplexing scheme is essential One prior art method to mitigate limited bit-cell current is through bit-cell current amplification, using a local amplifier connected to a global bit-fine. However, this solution has its own drawbacks as the amplifier input capacitance increases with the amplifier's larger current capabilities rendering the effective gains limited. Furthermore, the length of the global bit-line is still a challenge to be solved.

BRIEF DESCRIPTION OF THE FIGURES

The present application is illustrated by way of example, and not by way of limitation, in the figures of the accompanying drawings. The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DETAILED DESCRIPTION

A method and apparatus to mitigate limited bit-cell current through the use of repeaters is described. Repeater insertion is a suitable way of dealing with the limited bit-cell current and lengthy transmission line effect of the long bit-lines. The present application discloses a method of inserting and controlling repeaters in a static random access memory (SRAM) at a suitable locations, to break a lengthy bit-line into segments of reasonable size. The resulting SRAM memory, implemented in a multibank architecture, can be used at below nominal voltage at a high density.

Figure 1:
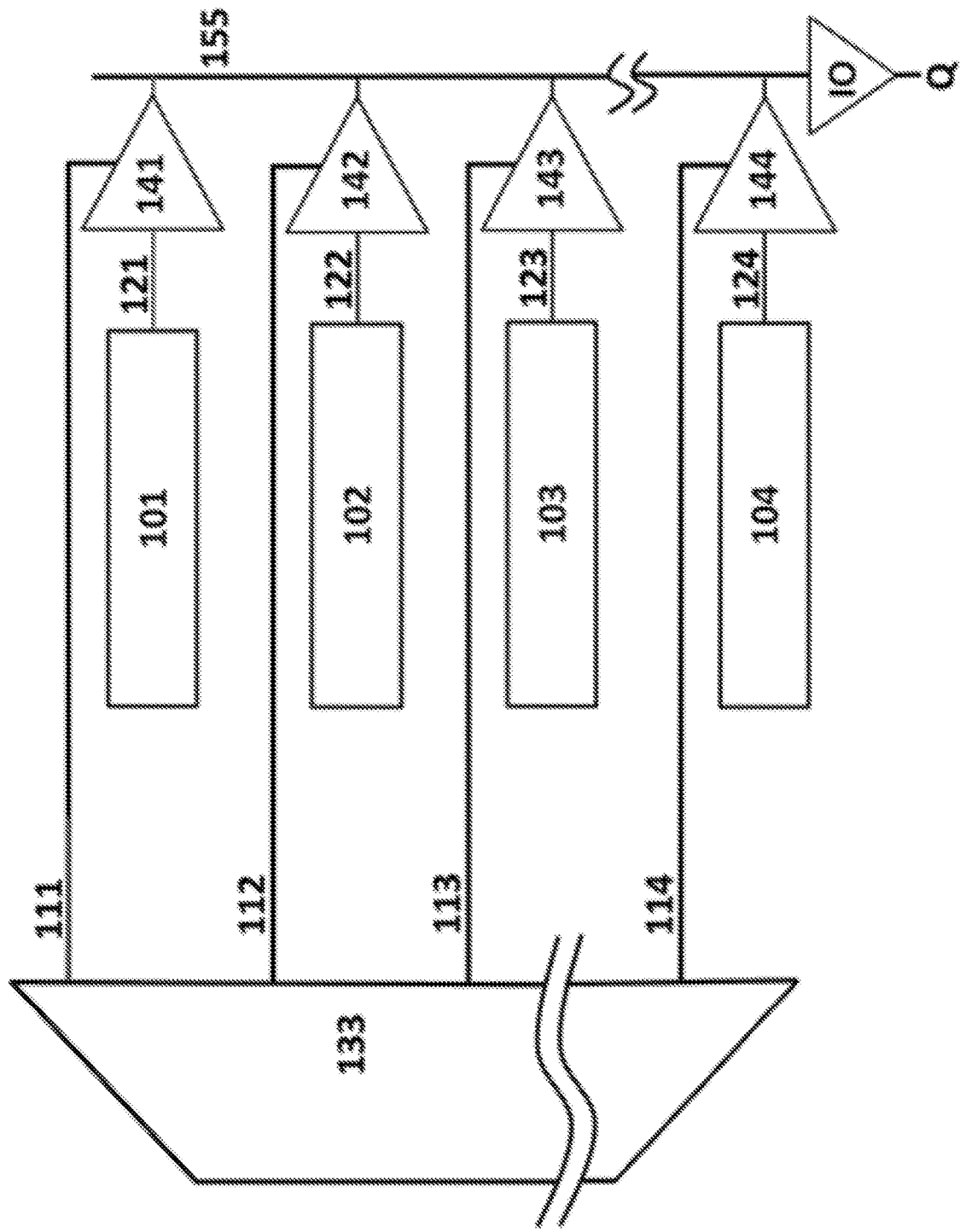
FIG. 1 is a block diagram of a conventional local and global bit-line arrangement for repeater insertions.

FIG. 1 illustrates a simplified multibank architecture for an SRAM. The data output of each of the banks from 101-104 is fed to a common global bit-line 155.

In one embodiment, a one-hot decoding scheme is used in SRAM arrays to select one local bit-line out of multiple lines. People versed in the state of the art are very familiar with this scheme.

Only one bank out of banks 101-104 is selected and connected to the global bit-line 155. In one embodiment, a one-hot decoder 133 activates the appropriate one of the bank select lines from 111-114. The bank select lines 111 to 114 are connected to tristate drivers 141-144.

During use, the one-hot decoder 133 enables one bank select line to 111 to 114 at any one time. This activates the respective tristate driver of 141-144, and connects the respective bank's local bit-line of 121-124 to the global bit-line 155.

The worst-case access time of the memory depends on the length of the global bit-line and on the location of the worst-case driver, which is the farthest driver from the global bit-line. In the embodiment illustrated in FIG. 1, this is the driver 141. The delay of the global bit-line increases quadratically with the bit-line length especially for the case where column multiplexing is not available.

Figure 2:
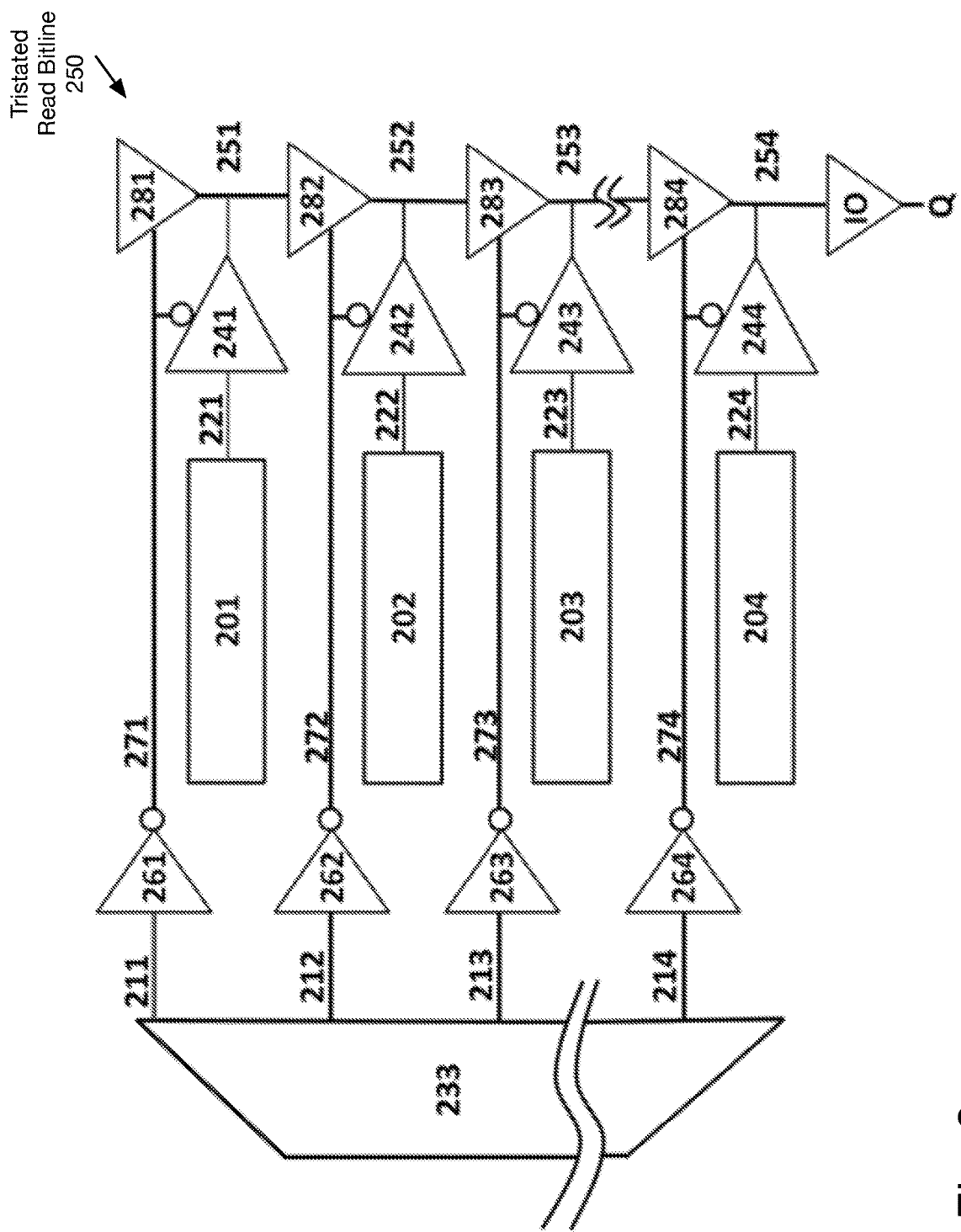
FIG. 2 is a block diagram of one embodiment of a bit-line repeater architecture for the repeater insertion on a read bit-line.

FIG. 2 illustrates breaking up the global bitline into multiple segments, to mitigate delays. The global bitline of a conventional SRAM such as the one shown in FIG. 1, is broken up into segments 251-254, as shown in FIG. 2.

Segments 251-254 of the global bit-line 250 are created by placing repeaters 281-284 at break points in the global bit-line 250. In one embodiment, each repeater 281-284 is controlled by the associated inverted bank line select signals, signals 271-274 respectively. In one embodiment, the inverted bank line select signals 271-274 enable and disable the repeaters 281-284. Therefore, the bank which is selected by the bank select signal can transmit the data on the global bit-line, by selecting its own driver 241-244 and at the same time deselecting the repeater 281-284 just before it only. All the subsequent repeaters are selected and are active for the connectivity to be complete. The structure thus created can eliminate the need for column multiplexed lines as the repeaters mitigate the quadratic delay effect. This reduces the sense time.

In one embodiment, the repeaters 281-284 are tri-state multiplexers. If there are decoders at least one line should always be ON. However, the control may not necessarily come from a decoder. In one embodiment, it can come through a set of word-line registers. These registers may be at a reset value on the onset and may load the decoder output after the first clock. However, in no case the lines will be left in a tri-stated arrangement in a real design.

In one embodiment, the drivers are tri-state drivers, because if the bank is selected it will drive it value on the bit-line. In such case, for a read the bank just above the selected bank must have its driver switched off. This can be done if the drivers are tri-stated.

By this insertion scheme and architecture, there is no need to keep a separate global bit-line, in addition to the global bitline 250 with the repeaters 281-284.

Figure 3:
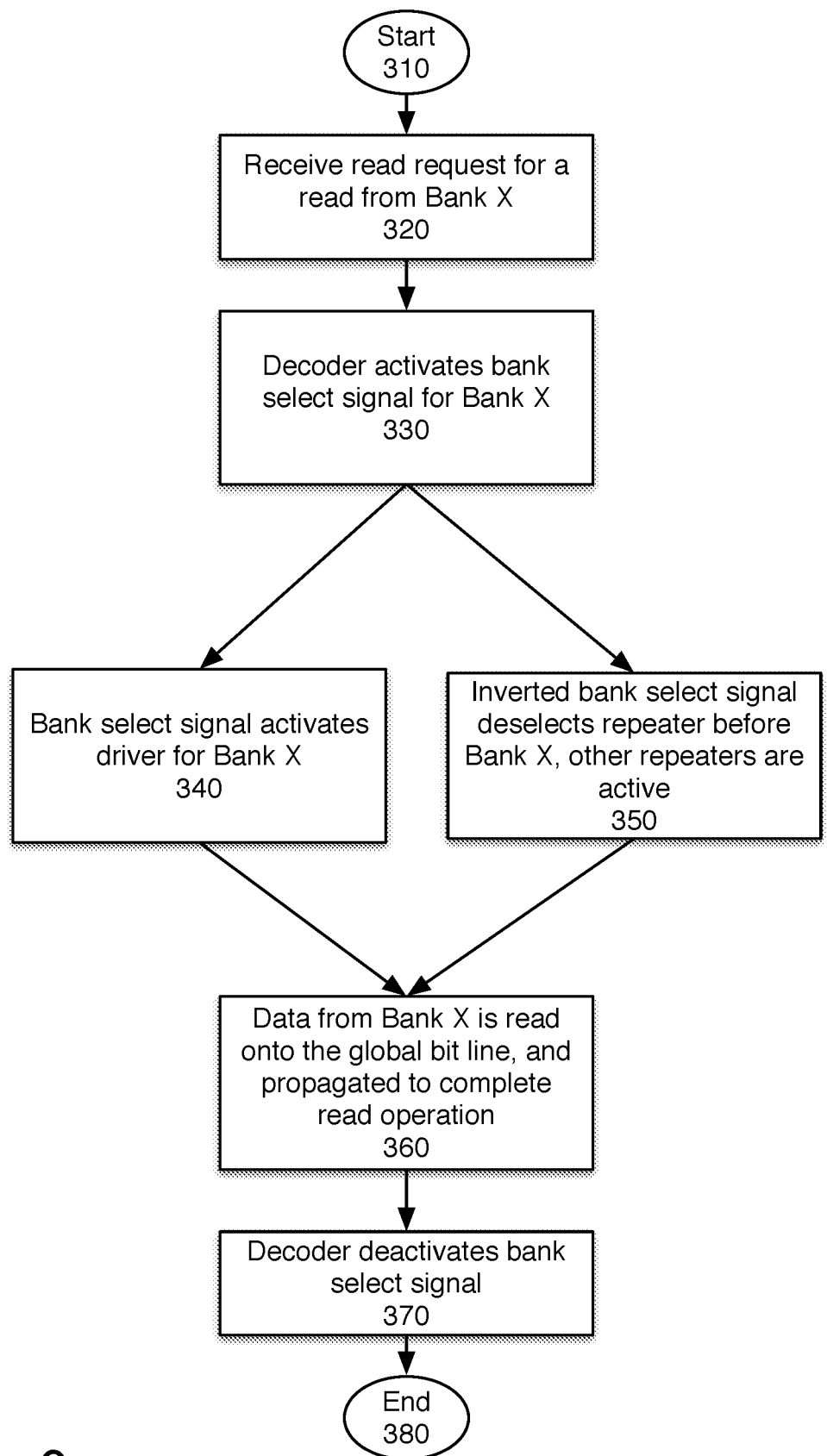
FIG. 3 is a flowchart of one embodiment of the process for reading data from the SRAM array with the bit-line repeater global bitline.

FIG. 3 is a flowchart of one embodiment of the process for reading data from the SRAM array with the bit-line repeater global bitline. The process starts at block 310.

At block 320, a read request is received for Bank X of the SRAM. The decoder activates the bank select signal for Bank X, at block 330.

At block 340, the bank select signal activates the driver for Bank X, thus enabling data to be read from Bank X. The inverted bank select signal deselects the repeater before Bank X. All other repeaters remain active. Referring to the configuration shown in FIG. 2, for example, when bank 203 is to be read, decoder 233 activates driver 243 using the bank select line 273. The repeater 283 is switched off, while all the subsequent repeaters are active (ON state), as the inverse of select lines 211 to 241 of the one-hot decoder 233, i.e. 271 to 274 selects/deselects them respectively.

Returning to FIG. 3, at block 360 the data is read from Bank X onto the global bitline, and propagated through the active repeaters, to complete the read operation.

At block 370, the decoder deactivates the bank select signal. The system is now ready for a next action. The process then ends at block 380.

Figure 4:
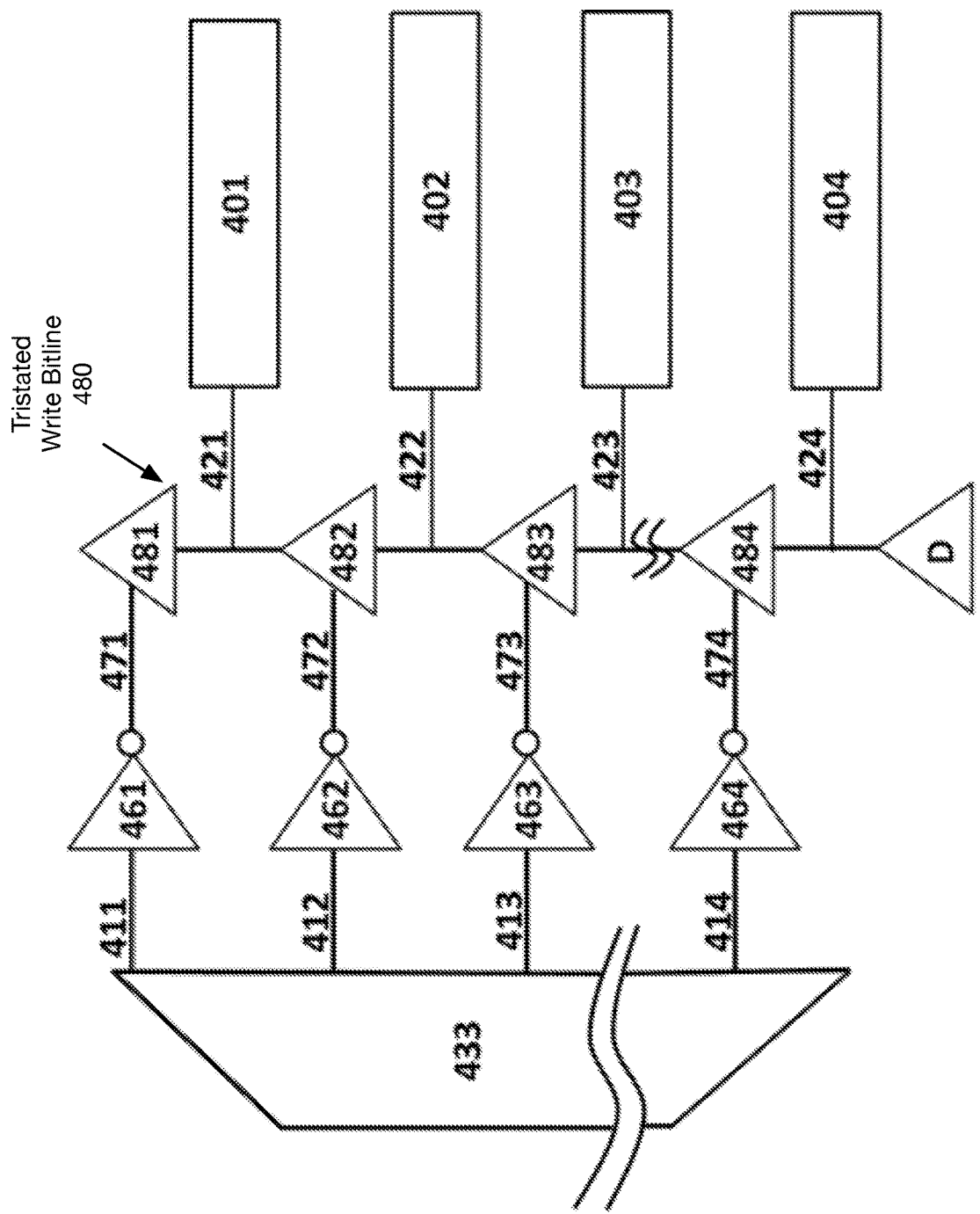
FIG. 4 is a block diagram of a SRAM including the drivers and repeaters in a global write line.

FIG. 4 is a block diagram of a SRAM including the drivers and repeaters in a global write line. The repeaters 481-484 are activated by write select signal, from decoder 433. The write drivers 481-484 are selected by signals 471-474, which are provided from inverters 461-464 by inverting signals 411-414 output from the decoder 433.

For example, when bank 402 is selected for writing, the write drivers from the D port to 483 are all selected by the inverted signal from the decoder 433, while the driver 482 associated with bank 402 is switched off. Thus the turned off driver ensures that the switching ON the write bit-line is not carried ahead of the repeater 482 associated with the bank 402 selected for writing.

In one embodiment, the configuration of the circuit uses the same decoder as the read embodiment described above, no additional circuit elements are needed to provide the repeater architecture for writing.

Using the same local write bit-line to insert the repeaters removes the need for a global bit-line for both read and write, which results in significant area and capacitance savings.

In one embodiment, the write drivers on the write bit-lines are not multiplexed. The write driver can directly drive any bit-cell connected to the write bit-line. In one embodiment, is not the case for a read bit-line. The read bit-line may be driven by any bit-cell along it. So each stage driver just before the active bank, should be switched off. Thus, in one embodiment, the write bit-line drivers may be disconnected from the decoder as they need no controls.

However, in another embodiment, the write buffers can be tri-stated to save power. When writing to any bank under the topmost bank, the bit-lines above the bank to which the system is writing do not need to be on. By using the decoder, the system can switch off the bank above the bank being written to. Although this arrangement does not save power in the worst-case write (which is writing in the top most bank), it still improves the average dynamic power, assuming only 50% access is in the upper half banks.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A static random access memory (SRAM) comprising:
a read bit-line including a plurality of repeaters positioned one after the other;
a plurality of data banks to store data, wherein each data bank is associated with one of the plurality of repeaters of the read bit-line;
a plurality of drivers connected between respective ones of the plurality of data banks and the read bit-line, each respective driver connected to the read bit-line after the repeater associated with its connected data bank;
an inverter, associated with a selected data bank of the plurality of data banks, receiving a bank select signal, producing an inverted bank select signal, and sending the inverted bank select signal to the repeater associated with the selected data bank, wherein a re-inverted version of the inverted bank select signal controls a first driver of the plurality of drivers to select its associated data bank, and to enable reading of data from the selected data bank, the first driver being connected between the selected data bank and the read bit-line; and
a decoder to provide the bank select signal to the inverter, wherein the inverted bank select signal disables the repeater associated with the selected data bank, which is a repeater positioned prior to the selected data bank, and the decoder enables repeaters of the read bit-line positioned after the selected data bank.

2. The SRAM of claim 1, further comprising:
a write bit-line including a plurality of repeaters;
the decoder to provide a bank select signal to select a second data bank; and
a repeater of the write bit-line, associated with the second data bank, is turned off so the write bit-line is not activated further than the selected second data bank.

3. The SRAM of claim 1, wherein the repeaters are tristate repeaters.

4. The SRAM of claim 1, further comprising:
a plurality of tristate write drivers.

5. The SRAM of claim 1, wherein the decoder comprises a one hot decoder.

6. The SRAM of claim 1, wherein the repeater associated with the selected data bank is included in a global bit-line that receives the data output from the selected data bank.

7. The SRAM of claim 1, wherein the decoder is a single decoder connected to the plurality of drivers and connected to the plurality of repeaters.

8. The SRAM of claim 1, wherein the inverter is located on a line directly between the decoder and the selected data bank.

9. A circuit comprising:
a bit-cell to write, read and store data;
a local read bit-line attached to a bit port of the bit-cell;
a local write bit-line attached to a write port of the bit-cell;
a read repeater inserted on the local read bit-line, and associated with the bit-cell;
a driver, between the bit-cell and the local read bit-line, connected to the read bit-line at a first position after the read repeater;
a write repeater inserted on the local write bit-line;

a decoder generating control signals for the read repeater and the write repeater inserted on the local read bit-line and the local write bit-line, respectively; and an inverter that receives a bank select signal from the decoder and produces an inverted bank select signal, wherein the bank select signal selects the bit-cell via the driver between the bit cell and the local read bit-line, and wherein the inverted bank select signal disables the read repeater, which is positioned prior to the first position, and the decoder enables other read repeaters positioned after the first position.

10. The circuit of claim 9, further comprising:
a plurality of bit-cell banks, each bit cell bank comprising one or more bit-cells connected to a tri-stated multiplexed bit-line.

11. The circuit of claim 9, wherein a plurality of local read bit-lines and local write bit-lines comprising the local read bit-line and the local write bit-line form a global bit-line, such that repeaters break the global bit-line into Hall the plurality of local read bit-lines and local read bit-lines.

12. The circuit of claim 9, further comprising:
tri-stateable repeaters, each connected before a respective local read bit-line.

13. The circuit of claim 12, wherein tri-stateable repeaters after the read repeater associated with the bit-cell are driven active when the bit-cell is selected by the bank select signal.

14. The circuit of claim 13, wherein repeaters before the selected bit-cell are active (on), and the read repeater associated with the selected bit-cell is inactive (off).

15. The circuit of claim 9, wherein the write bit-line repeater is a conventional non-tristate buffer.

16. The circuit of claim 9, wherein the decoder controls a plurality of read repeaters and a plurality of write repeaters.

17. A method to mitigate bit-cell current through a static random access memory (SRAM) having a read bit-line with a plurality of repeaters, the method comprising:
receiving a read request for a read from a first bank of the SRAM;
activating a bank select signal for the first bank for reading;
activating a driver for the first bank using the bank select signal to connect the first bank to the read bit-line at a first node;
disabling a repeater positioned on the read bit-line prior to the first node using an inverted version of the bank select signal, and enabling repeaters positioned on the read bit-line after the first node;
reading data from the first bank onto the read bit-line via the first node; and
deactivating the bank select signal.

18. The method of claim 17, wherein the read bit-line including the plurality of repeaters forms a global read bit-line.

19. The method of claim 17, further comprising:
decoding the read request to obtain the bank select signal, wherein a decoder comprises a one hot decoder.

20. The method of claim 19, wherein the SRAM further includes a write bit-line including a second plurality of repeaters, and wherein the method further comprises writing data to a second bank of the SRAM, the method comprising:
decoding a write request signal to obtain a second bank select signal to select the second bank for writing; and
turning off one of the second plurality of repeaters associated with the first bank so the write bit-line is not activated further than the second bank.

21. The method of claim 17, wherein the repeaters are tristate repeaters.

* * * * *